United States Patent
Okada et al.

(10) Patent No.: US 7,034,376 B2
(45) Date of Patent: Apr. 25, 2006

(54) SCHOTTKY BARRIER DIODE SEMICONDUCTOR DEVICE

(75) Inventors: Tetsuya Okada, Kumagaya (JP); Hiroaki Saito, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/953,073

(22) Filed: Sep. 30, 2004

(65) Prior Publication Data
US 2005/0139947 A1 Jun. 30, 2005

(30) Foreign Application Priority Data
Dec. 25, 2003 (JP) .............................. 2003-429802

(51) Int. Cl.
*H01L 31/108* (2006.01)
(52) U.S. Cl. ...................................... 257/471
(58) Field of Classification Search .................. None
See application file for complete search history.

(56) References Cited

U.S. PATENT DOCUMENTS

| 5,017,976 A | * | 5/1991 | Sugita |
| 6,426,541 B1 | | 7/2002 | Chang et al. |
| 2004/0061195 A1 | | 4/2004 | Okada et al. |

FOREIGN PATENT DOCUMENTS

| JP | 0077004 A2 * | 4/1983 |
| JP | 2004-127968 | 4/2004 |
| TW | 501203 | 9/2002 |

* cited by examiner

Primary Examiner—Nathan J. Flynn
Assistant Examiner—Kevin Quinto
(74) Attorney, Agent, or Firm—Morrison & Foerster LLP (57) ABSTRACT

A Schottky barrier diode in which a $p^+$-type semiconductor layer is provided in an $n^-$-type epitaxial layer can realize lowering the forward voltage VF without considering leak current IR. However, when compared with a normal Schottky barrier diode, the forward voltage VF is generally high. When a Schottky metal layer is suitably selected, although the forward voltage VF can be reduced, there is a limit in further reduction. On the other hand, when the resistivity of the $n^-$-type semiconductor layer is reduced, although the forward voltage VF can be realized, there is a problem that breakdown voltage is deteriorated. In a semiconductor device of the invention, a second $n^-$-type semiconductor layer having a low resistivity is laminated on a first $n^-$-type semiconductor layer capable of securing a specified breakdown voltage. $P^+$-type semiconductor regions are made to have depths equal to or slightly deeper than the second $n^-$-type semiconductor layer. By this, in a Schottky barrier diode in which leak current IR can be suppressed by pinch off of a depletion layer, the forward voltage VF can be reduced and the specified breakdown voltage can be secured.

6 Claims, 8 Drawing Sheets

SCHOTTKY BARRIER DIODE SEMICONDUCTOR DEVICE

BACKGROUND OF THE INVENTION

1. Field of the Invention

The present invention relates to a semiconductor device, and particularly to a semiconductor device in which low forward voltage VF and low reverse current IR characteristics of a Schottky barrier diode are improved.

2. Description of the Related Art

Figure 7A:
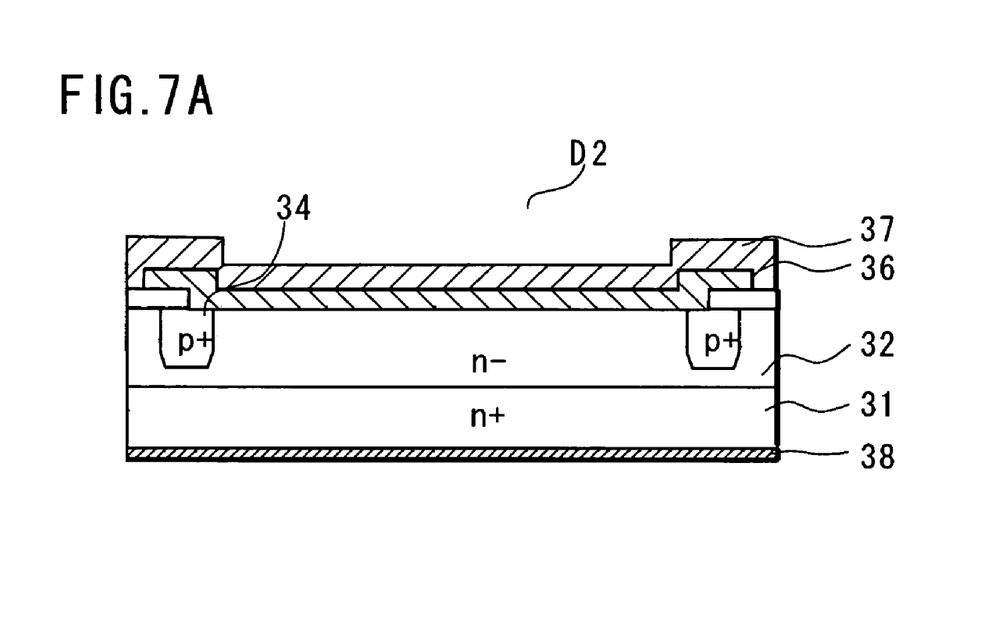
FIGS. 7A and 7B are sectional views for illustrating conventional semiconductor devices.
Figure 7B:
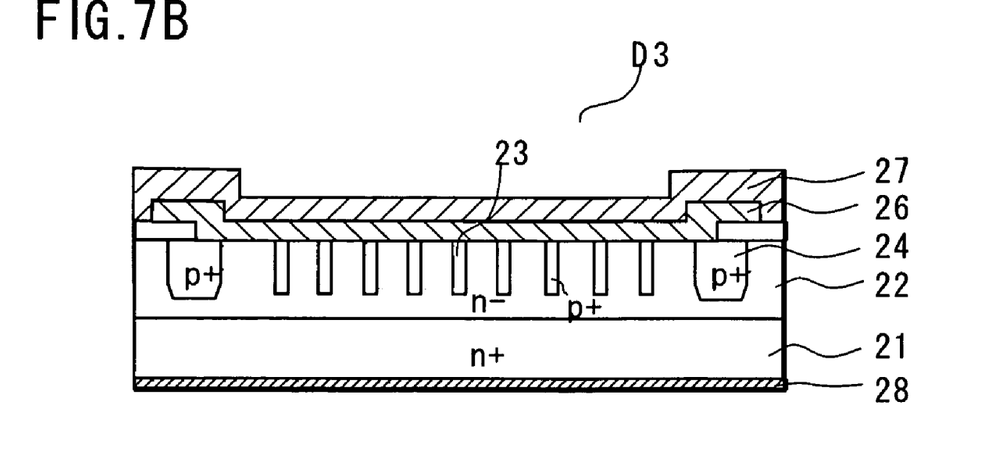

FIGS. 7A and 7B are sectional views of conventional Schottky barrier diodes D2 and D3.

In the Schottky barrier diode D2 of FIG. 7A, an $n^-$-type semiconductor layer 32 is laminated on an $n^+$-type semiconductor substrate 31, a guard ring 34 for securing breakdown voltage at the time of applying reverse voltage of the Schottky barrier diode D2 is provided at the periphery, and a Schottky metal layer 36 of Mo or the like for forming a Schottky junction with the surface of the semiconductor layer 32 is provided.

An anode electrode 37 is provided on the Schottky metal layer 36, and a cathode electrode 38 is provided on the back surface of the substrate 31. Current flows at the time of applying forward voltage, and current does not flow at the time of applying reverse voltage by Schottky barrier.

Forward voltage VF as a rising voltage of the Schottky barrier diode D2 and leak current IR at the time of applying the reverse voltage are determined by a work function difference (hereinafter referred to as φBn) obtained at the Schottky junction between the Schottky metal layer 36 and the surface of the semiconductor layer 32. In general, there is a relation of trade-off in which when φBn is high, the forward voltage VF becomes high, and leak current IR is lowered.

The Schottky barrier diode D3 having a structure shown in FIG. 7B is also known.

In the Schottky barrier diode D3, an $n^-$-type semiconductor layer 22 is laminated on an $n^+$-type semiconductor substrate 21. The resistivity of the $n^-$-type semiconductor layer 22 is, for example, about 1 Ω·cm when the diode is a 40V series device.

A plurality of $p^+$-type regions 23 are formed in the semiconductor layer 22 by diffusion of high concentration p-type impurities or the like. The interval of the adjacent $p^+$-type regions 23 is such a distance that a depletion layer is pinched off.

In order to secure the breakdown voltage at the time of applying the reverse voltage of the Schottky barrier diode D3, a guard ring 24 is provided by diffusion of high concentration p-type impurities or the like to surround the outer periphery of all the $p^+$-type semiconductor regions 23. All the $p^+$-type semiconductor regions 23 disposed inside of the guard ring 24 and the surface of the semiconductor layer 22 are in contact with a Schottky metal layer 26.

The Schottky metal layer 26 is made of, for example, Mo, and forms a Schottky junction with the surface of the semiconductor layer 22. For example, an Al layer is provided as an anode electrode 27 on the Schottky metal layer 26, and a cathode electrode 28 is provided on the back surface of the $n^+$-type semiconductor substrate 21.

In this case, since the Schottky metal layer 26 can be regarded as a false $p^+$-type region, the Schottky metal layer 26 and the $p^+$-type regions 23 can be regarded as a continuous p-type region.

In the Schottky barrier diode D3, when forward voltage is applied, current flows. On the other hand, when reverse voltage is applied, the depletion layer is extended by the pn junction between the combination of the $p^+$-type regions 23 and the Schottky metal layer 26, and the $n^-$-type semiconductor layer 22. At this time, a leak current corresponding to the kind of the Schottky metal layer 26 is generated at the interface between the semiconductor layer 22 and the Schottky metal layer 26.

However, since the $p^+$-type regions 3 are disposed at intervals of such a distance that the depletion layer is extended and is pinched off, the leak current generated at the interface is suppressed by the depletion layer, and leak to the cathode electrode 28 side can be prevented.

That is, while a characteristic is held in which a specified forward voltage VF can be obtained, it is possible to suppress the increase of the leak current (IR) due to the increase of the reverse voltage (VR) (see, for example, Japanese Laid Open Patent Publication No. 2004–127968).

When the diodes having the same chip size (Schottky junction area) are compared with each other, the actual Schottky junction area (area of the $n^-$-type semiconductor layer) of the Schottky barrier diode D3 is smaller than that of the Schottky barrier diode D2 (FIG. 7A).

In general, in the case where the same resistivity of the $n^-$-type semiconductor layer and the same Schottky metal layer are provided, when the Schottky junction area is small, the forward voltage VF becomes high.

Figure 8A:
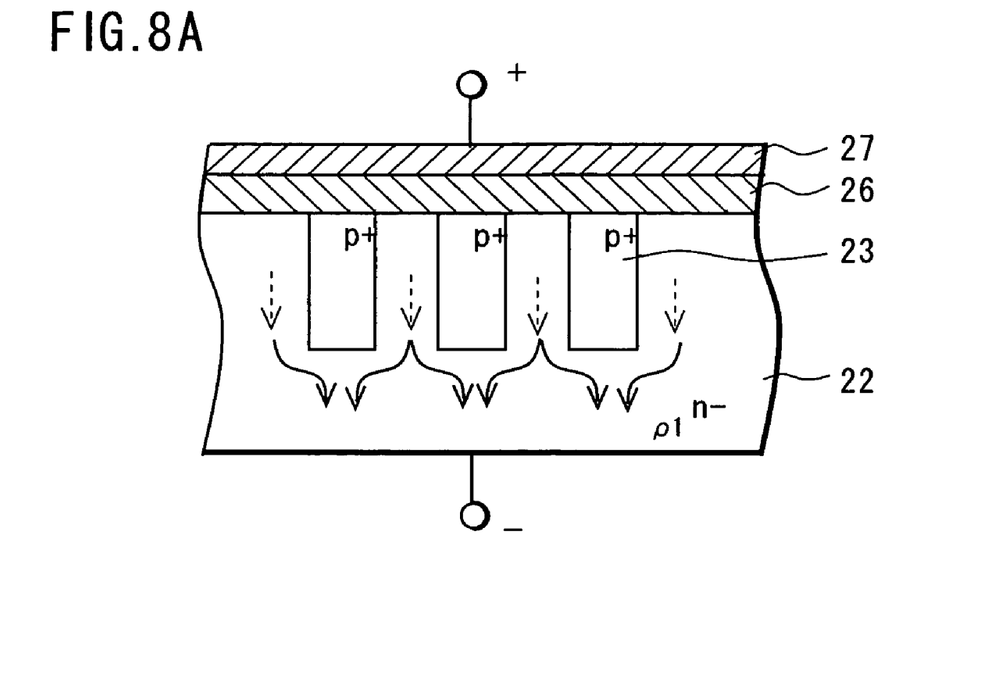
FIGS. 8A and 8B are sectional views for illustrating the conventional semiconductor device.

Besides, in the Schottky barrier diode D3, since the $n^-$-type semiconductor layer between the adjacent $p^+$-type region 23 becomes a current path, the resistance of a region above the $n^-$-type semiconductor layer becomes higher than that of the Schottky barrier diode D2 (FIG. 8A).

That is, in the case where the chip size, the resistivity ρ1 of the $n^-$-type semiconductor layer and the Schottky metal layer are the same, when the structure of the Schottky barrier diode D3 is adopted, the forward voltage VF becomes high.

Figure 8B:
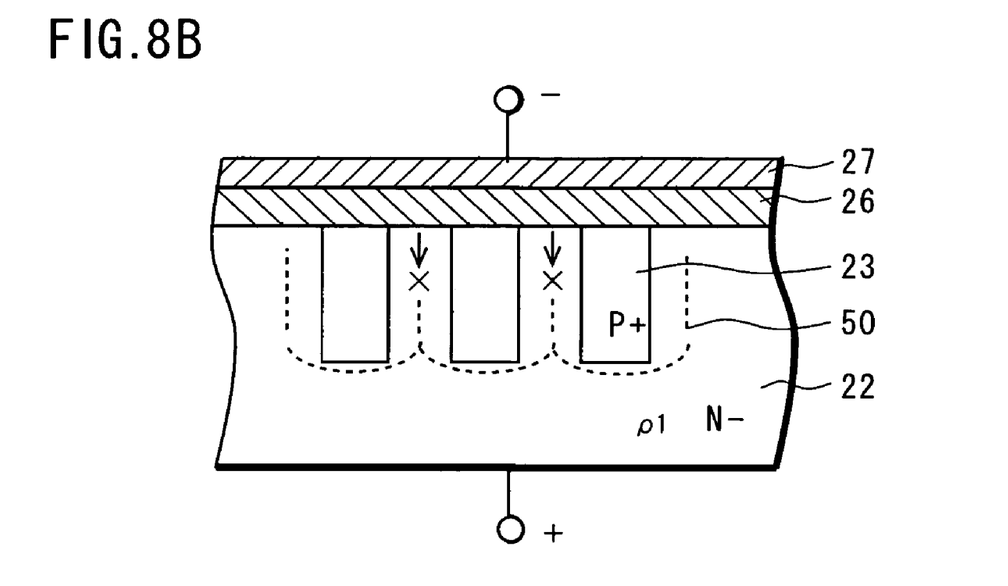

It is conceivable that the resistance value of the narrow current path is reduced by lowering the resistivity ρ1 of the $n^-$-type semiconductor layer 22 to achieve lowering the forward voltage VF. However, in this method, the resistivity of the $n^-$-type semiconductor layer 22 below the $p^+$-type region 23, which determines the breakdown voltage, is also lowered. Accordingly, there has been a problem that the extension of the depletion layer becomes insufficient, and a specified breakdown voltage can not be secured (FIG. 8B).

SUMMARY OF THE INVENTION

The present invention has been made in view of the problems as described above, and the problems are solved first by a semiconductor device including a one-conductivity type semiconductor substrate, a first one-conductivity type semiconductor layer provided on the substrate, a second one-conductivity type semiconductor layer provided on the first one-conductivity type semiconductor layer and having a resistivity lower than the first one-conductivity type semiconductor layer, a plurality of opposite conductivity type semiconductor regions provided in the first and the second one-conductivity type semiconductor layers, and a metal layer provided on a surface of the opposite conductivity type semiconductor regions and the second one-conductivity type semiconductor layer and forming a Schottky junction with at least the surface of the second one-conductivity type semiconductor layer, wherein the adjacent opposite conductivity type semiconductor regions are disposed to be separated from each other by a distance at which a depletion layer extending from the opposite conductivity type semiconductor region at a time of applying reverse voltage is pinched off.

The opposite conductivity type semiconductor regions are provided to pass through the second one-conductivity type semiconductor layer and to reach the first one-conductivity type semiconductor layer.

A thickness of the second one-conductivity type semiconductor layer is equal to or slightly shallower than depths of the opposite conductivity type semiconductor regions.

The first one-conductivity type semiconductor layer has a resistivity in which a specified breakdown voltage can be secured.

The opposite conductivity type semiconductor regions are made of opposite conductivity type semiconductor materials embedded in trenches provided in the first and the second one-conductivity type semiconductor layers.

The opposite conductivity type semiconductor regions are regions in which opposite conductivity type impurities are diffused in the first and the second one-conductivity type semiconductor layers.

According to the invention, since the resistivity of the second $n^-$-type semiconductor layer between $p^+$-type semiconductor regions 3, which becomes a narrow current path at the time of applying forward voltage, is low, the inclination of a VF-IF characteristic at the time of applying the forward voltage is made steep, and the forward voltage VF can be reduced. Further, the resistivity of a first $n^-$-type semiconductor layer 11 below the $p^+$-type semiconductor regions 3, which determines the breakdown voltage, can be made such a value that a specified breakdown voltage can be secured. That is, while the specified breakdown voltage is secured, the forward voltage VF can be reduced.

In the case where the breakdown voltage is made further high, the resisitivity $\rho 1$ of the first $n^-$-type semiconductor layer 11 has only to be made high. Since a second $n^-$-type semiconductor layer 12 can hold the resistivity in which the specified forward voltage VF characteristic can be obtained, there is an advantage in raising the breakdown voltage.

DETAILED DESCRIPTION OF THE INVENTION

Some embodiments of the invention will be described in detail with reference to FIGS. 1A to 6B.

Figure 1A:
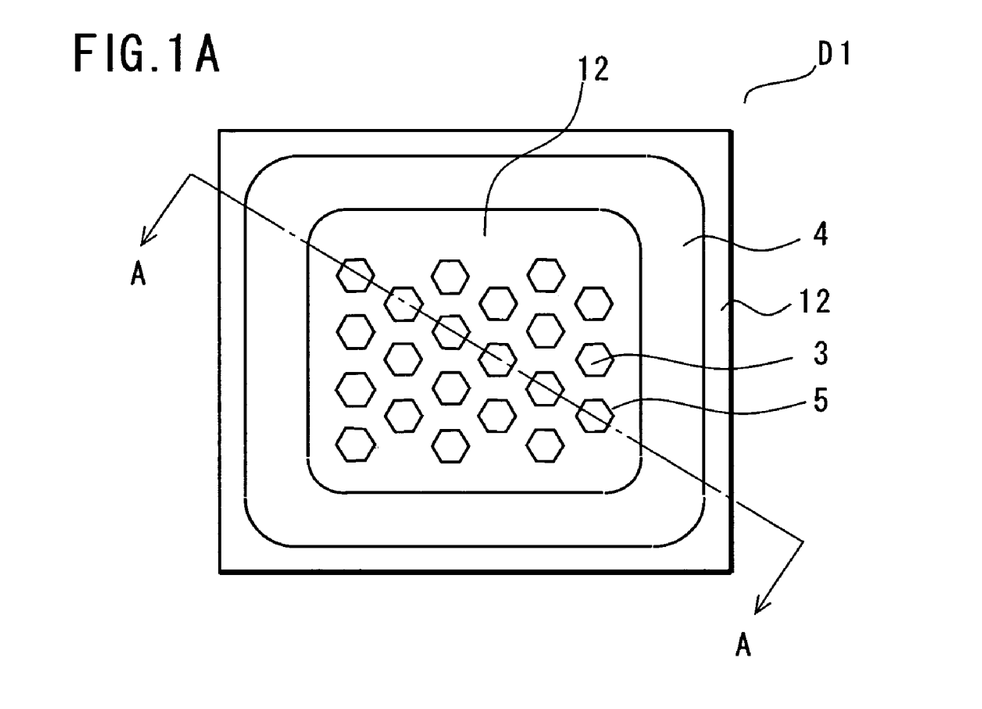
FIG. 1A is a plan view and FIG. 1B is a sectional view for showing a semiconductor device according to an embodiment of the invention.
Figure 1B:
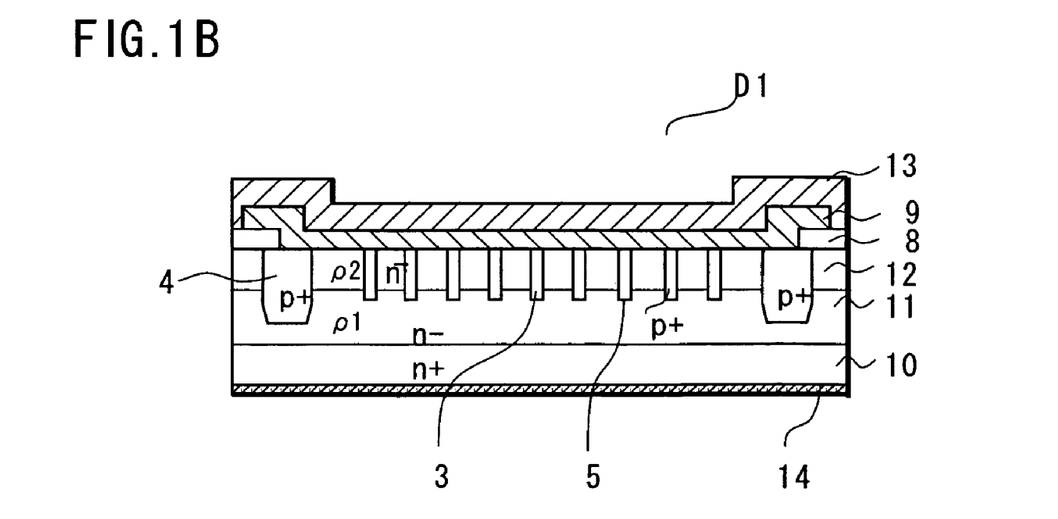

FIGS. 1A and 1B show a Schottky barrier diode according to an embodiment of the invention. FIG. 1A is a plan view and FIG. 1B is a sectional view taken along the line A—A of FIG. 1A. In FIG. 1A, a Schottky metal layer and an anode electrode on the surface of a substrate are omitted.

A Schottky barrier diode D1 of this embodiment of the invention comprises a one-conductivity type semiconductor substrate 10, a first one-conductivity type semiconductor layer 11, a second one-conductivity type semiconductor layer 12, opposite conductivity type semiconductor regions 3, a high concentration impurity region 4, and a Schottky metal layer 9.

A substrate is such that the first $n^-$-type semiconductor layer 11 is laminated on the $n^+$-type silicon semiconductor substrate 10 by, for example, epitaxial growth, and the second $n^-$-type semiconductor layer 12 is further laminated on the upper layer thereof. The second $n^-$-type semiconductor layer 12 may be such that ions are implanted in an upper layer portion of the first $n^-$-type semiconductor layer 11 to raise the impurity concentration thereof so that the second $n^-$-type semiconductor layer 12 is formed.

In order to secure a specified breakdown voltage, for example, in a Schottky barrier diode having a breakdown voltage of 40 V, the first $n^-$-type semiconductor layer 11 has a resistivity $\rho 1$ of about 1 $\Omega \cdot cm$.

The second $n^-$-type semiconductor layer 12 has a resistivity $\rho 2$ of about 0.5 $\Omega \cdot cm$ lower than the first $n^-$-type semiconductor layer A plurality of $p^+$-type semiconductor regions 3 are provided in the first $n^-$-type semiconductor layer 11 and the second $n^-$-type semiconductor layer 12. Each of the $p^+$-type semiconductor regions 3 has a hexagonal shape with an opening width (width in a diagonal) of 1 $\mu m$, and they are provided in the $n^-$-type semiconductor layers 11 and 12 to be separated from each other by about 1 $\mu m$ to 10 $\mu m$, for example. This distance is such that when reverse voltage is applied to the Schottky barrier diode D1, the depletion layer is pinched off. Although described later in detail, since the adjacent $p^+$-type semiconductor regions 3 are required to be disposed at regular intervals, it is desirable that the shape of each of them is an equilateral hexagonal shape.

The $p^+$-type semiconductor regions 3 are provided to pass through the second $n^-$-type semiconductor layer 12 and to reach the first $n^-$-type region 11. Although described later, in order to secure a specified breakdown voltage and to reduce forward voltage VF, the thickness of the second $n^-$-type semiconductor layer 12 is made equal to or slightly shallower than the depth of the $p^+$-type semiconductor region 3. The depth of the $p^+$-type semiconductor region 3 is made, for example, about 1 $\mu m$.

Besides, the $p^+$-type semiconductor region 3 is, for example, a region in which polysilicon including high concentration p-type impurities is embedded in a trench.

The guard ring 4 is a p-type high concentration impurity region provided to surround the outer periphery of all the $p^+$-type semiconductor regions 3 in order to secure the breakdown voltage at the time of applying the reverse voltage of the Schottky barrier diode. It is necessary that a part of the guard ring 4 is brought into contact with the Schottky metal layer 9, and the guard ring 4 is provided to have a width of about 20 $\mu m$ in consideration of alignment shift of a mask. The surface of the $n^-$-type semiconductor layer 12 inside of the guard ring 4 forms a Schottky junction with the Schottky metal layer 9.

The guard ring 4 is provided to be equal to or deeper than the p+-type semiconductor region 3 according to the breakdown voltage. In this embodiment, in order to secure the high breakdown voltage, the guard ring 4 is provided to be deeper than the p+-type semiconductor region 3 by ion implantation and diffusion of high concentration p-type impurities. Similarly to the p+-type semiconductor regions 3, the guard ring 4 may be a region in which p-type polysilicon is embedded in a trench.

The Schottky metal layer 9 is made of, for example, Mo, is in contact with the n−-type semiconductor layer 12 and all the p+-type semiconductor regions 3, and forms the Schottky junction with the n−-type semiconductor layer 12. As an anode electrode 13, for example, an Al layer is provided on the Schottky metal layer 9, and a cathode electrode 14 is provided on the back surface of the n+-type semiconductor substrate 10.

Figure 2A:
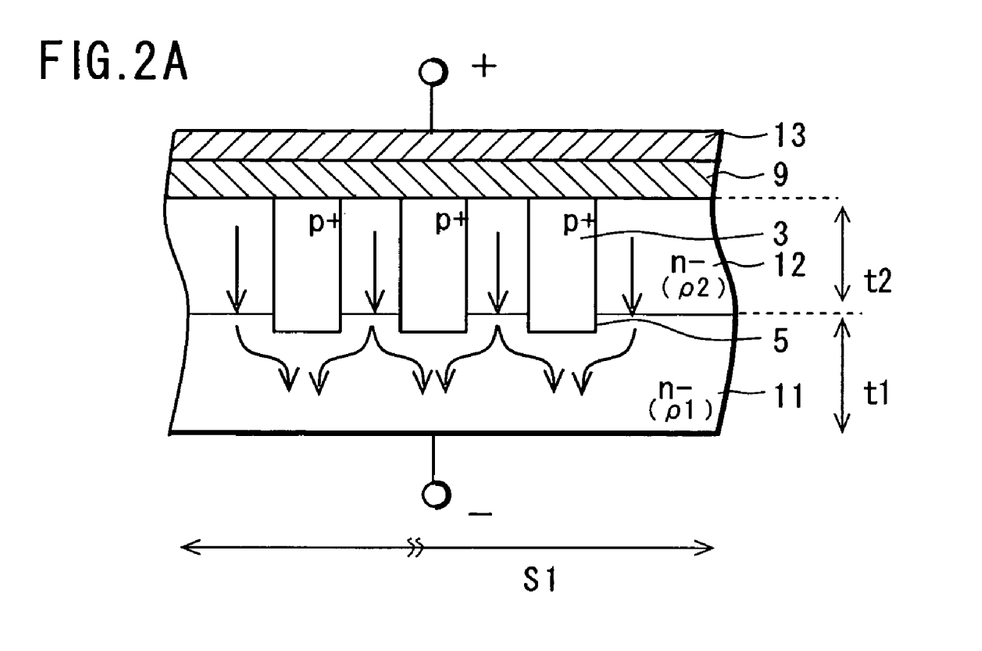
FIGS. 2A and 2B are sectional views for showing the semiconductor device according to the embodiment of the invention.
Figure 2B:
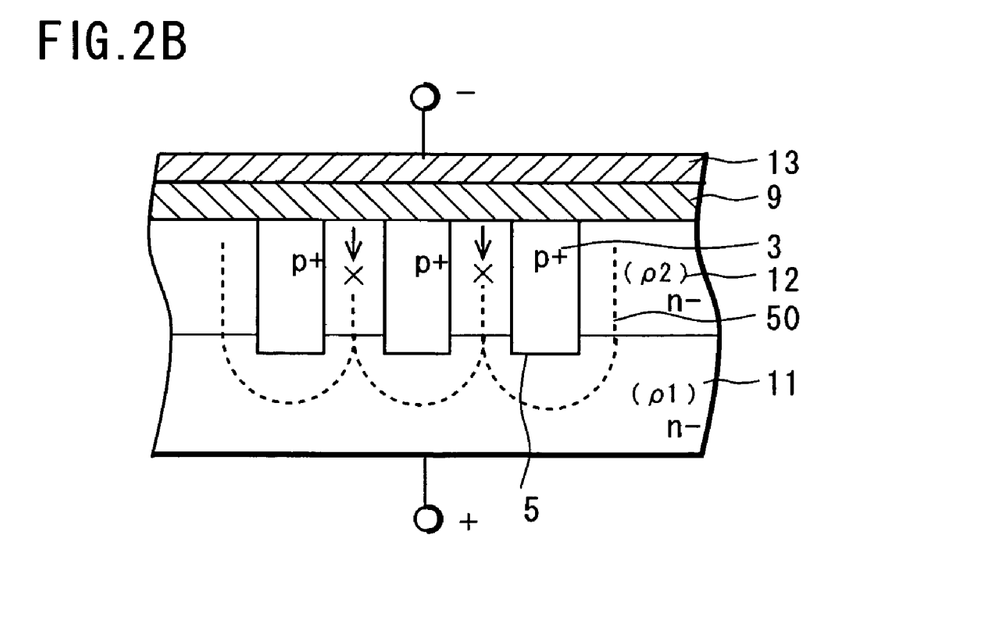

FIGS. 2A and 2B are enlarged sectional views of a portion of the p+-type semiconductor regions 3. FIG. 2A shows a state when forward voltage is applied, and FIG. 2B shows a state when reverse voltage is applied.

As shown in FIG. 2A, current (indicated by arrows) flows at the time of applying the forward voltage, and at this time, the second n−-type semiconductor layer 12 between the p+-type semiconductor regions 3, which becomes a narrow current path, has the low resistivity ρ2. Accordingly, since the resistance of the narrow current path can be reduced, the forward voltage VF can be reduced. Although a portion below the p+-type semiconductor region 3 is the first n−-type semiconductor layer 11 having the high resistivity ρ1, since the current path therein is sufficiently wide, there is not a large influence.

On the other hand, as shown in FIG. 2B, at the time of applying the reverse voltage of the Schottky barrier diode D1, a depletion layer 50 as indicated by a broken line is extended in the first and the second n−-type semiconductor layers 11 and 12 between the p+-type semiconductor regions 3 by the pn junction between the combination of the p+-type semiconductor regions 3 and the Schottky metal layer 9, and the second n−-type semiconductor layer 12.

As described before, the p+-type semiconductor regions 3 are disposed at intervals of a specified distance to be uniformly separated from each other. The specified distance is such a distance that at the time of applying the reverse voltage, the depletion layer 50 extending from the p+-type semiconductor region 3 to the second n−-type semiconductor layer 12 is pinched off. That is, the second n−-type semiconductor layer 12 between the p+-type semiconductor regions 3 is completely filled with the depletion layer 50.

The first n−-type semiconductor layer 11, which determines the breakdown voltage, below the p+-type semiconductor regions 3 has the resistivity (for example, 1 Ω·cm) in which the specified breakdown voltage can be secured, and can sufficiently extend the depletion layer 50.

That is, the resistivity ρ2 of the second n−-type semiconductor layer 12 which becomes the narrow current path at the time of applying the forward voltage is made lower than the resistivity ρ1 of the first n−-type semiconductor layer 11, so that the forward voltage VF can be reduced. Further, since the first n−-type semiconductor layer 11 below the p+-type semiconductor regions 3 has the high resistivity ρ1, the specified breakdown voltage can be sufficiently secured at the time of applying the reverse voltage.

The depth of the p+-type semiconductor region 3 is made equal to or slightly deeper than that of the second n−-type semiconductor layer 12. The reason is as follows. When the region (the second n−-type semiconductor layer 12) having the low resistivity is too shallow, the current path of the low resistivity becomes short, and therefore, the forward voltage VF can not be sufficiently reduced. When the region having the low resistivity is too deep, the extension of the depletion layer 50 below the p+-type semiconductor region 3 at the time of applying the reverse voltage is not sufficient, and the breakdown voltage is deteriorated.

Here, with respect to the shapes of the p+-type semiconductor regions 3, since it is necessary that they are disposed at regular intervals so that the depletion layer 50 is uniformly extended at the time of applying the reverse voltage to completely fill the second n−-type semiconductor layer 12, the equilateral hexagonal shape is optimum (see FIG. 1A). When there is a part where the extension of the depletion layer 50 is insufficient, current leaks therefrom to the cathode electrode 14 side. Thus, as long as distances can be secured so that portions between all the p+-type semiconductor regions 3 are completely filled with the extension of the depletion layer 50, the shapes of the p+-type semiconductor regions 3 are not limited to the equilateral hexagonal shape.

In the case where the separation distances of the p+-type semiconductor regions 3 can be secured to a certain degree, they may be diffusion regions in which high concentration p-type impurities are ion implanted and diffused in the first and the second n−-type semiconductor layers 11 and 12 by using a mask with equilateral hexagonal openings. However, in the case where the separation distances are narrow, since the extension in a lateral direction can not be avoided in the impurity diffusion region, it is preferable to adopt the p+-type semiconductor regions 3 in which polysilicon is embedded in a trench.

The reduction of the forward voltage VF of the Schottky barrier diode D1 can be realized by reducing the resistance of the whole device. As shown in FIG. 2A, most of the resistance of the Schottky barrier diode D3 is given by chip size (S1)×resistivity ρ1×thickness (t1) of the first n−-type semiconductor layer 11+(S1×area ratio of the second n−-type semiconductor layer 12)×resistivity ρ2× thickness (t2) of the second n−-type semiconductor layer 12.

That is, in this embodiment, by lowering the resistivity ρ2, the resistance of the Schottky barrier diode D1 is reduced and the reduction of the forward voltage VF can be realized without changing the values of the chip size, the breakdown voltage, and the leak current.

Figure 3:
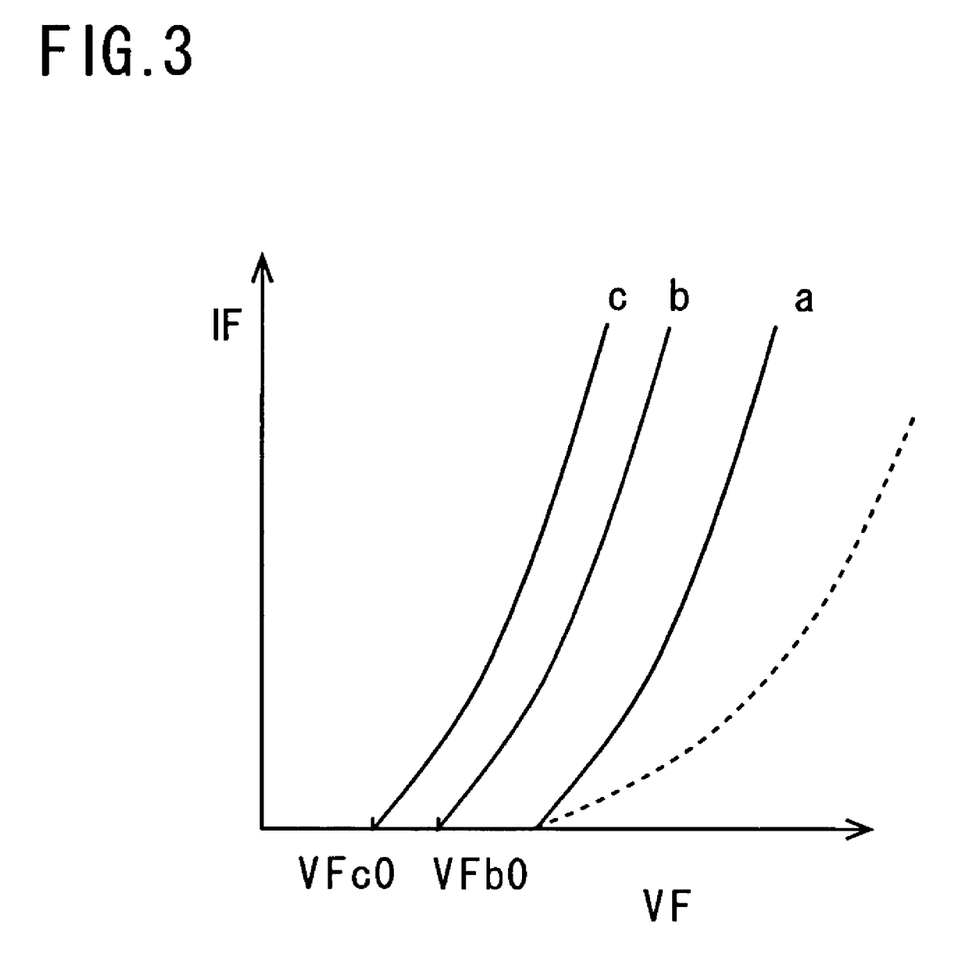
FIG. 3 is a characteristic view for illustrating the semiconductor device according to the embodiment of the invention.

FIG. 3 shows VF-IF characteristics. A solid line "a" indicates the characteristic of the Schottky barrier diode D1 of this embodiment, and a dotted line indicates the characteristic of the conventional Schottky barrier diode D3 shown in FIG. 7B.

In the case where the same Schottky metal layer is adopted, the conventional characteristic indicated by the dotted line is changed to the characteristic of the solid line "a". That is, in this embodiment, the inclination of the IF-VF characteristic is made steep and the reduction of the forward voltage VF can be realized. Here, as already described, when φBn is reduced, the forward voltage VF can be reduced. Thus, when the Schottky metal layer 9 having lower φBn is used, as indicated by solid lines "b" and "c", rising voltages (VFb0, VFc0) in the forward direction can be reduced.

When the metal layer having low φBn is adopted, the leak current IR is increased. However, the current flowing to the cathode electrode 14 can be suppressed by the depletion layer 50 extending from the p+-type semiconductor region 3.

Next, an example of a manufacturing method of a Schottky barrier diode of another embodiment of the invention will be described with reference to FIGS. 4A to 6B.

Figure 4A:
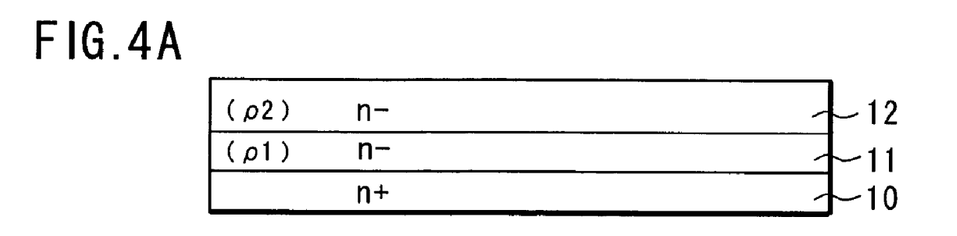
FIGS. 4A to 4C are sectional views for illustrating a manufacturing method of a semiconductor device according to an embodiment of the invention.

As shown in FIG. 4A, a first n⁻-type semiconductor layer 11 having a resistivity ρ1 of, for example, about 1 Ω·cm is laminated on an n⁺-type semiconductor substrate 10 by, for example, epitaxial growth. A second n⁻-type semiconductor layer 12 having a resistivity ρ2 of, for example, about 0.5 Ω·cm is further laminated thereon by epitaxial growth (or ion implantation).

An oxide film (not shown) is formed on the whole surface. Although not shown, the oxide film is opened at the outermost periphery of the substrate, high concentration n⁻-type impurities are deposited and diffused, and an annular ring is formed.

Figure 4B:
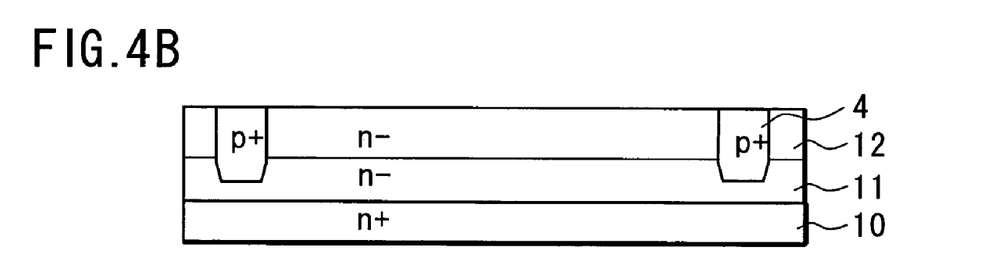

As shown in FIG. 4B, a guard ring 4 for securing breakdown voltage is formed by ion implantation and diffusion of high concentration p-type impurities. The guard ring 4 is formed so as to surround the periphery of p⁺-type semiconductor regions formed in a later process, and its depth is formed to be equal to or deeper than that of the p⁺-type semiconductor regions 3 according to the breakdown voltage.

Since it is necessary that the guard ring 4 is also in contact with a Schottky metal layer, a certain width (for example, about 20 μm) is required in consideration of alignment shift of a mask. Since the guard ring 4 is a diffusion region, when viewed in sectional shape, the curvature in the vicinity of a bottom can be relieved, electric field concentration in this portion can be suppressed, and it is suitable for a model of high breakdown voltage.

Figure 4C:
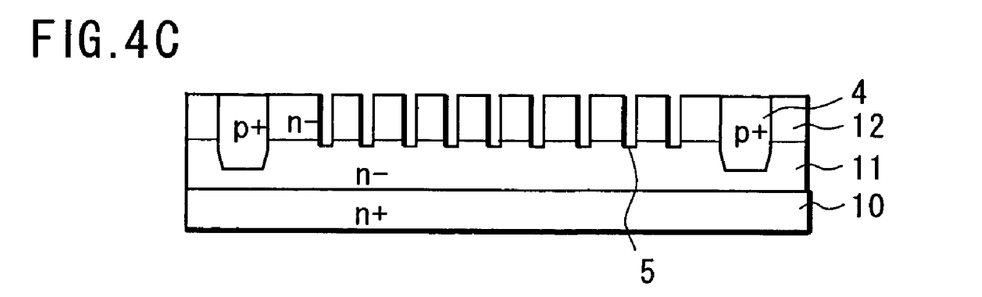

Next, in FIG. 4C, a mask with hexagonal openings having an opening width (width in a diagonal) of about 1 μm is used, and a plurality of trenches 5 are formed in the first n⁺-type semiconductor layer 11 and the second n⁻-type semiconductor layer 12. The trenches 5 are formed to pass through the second n⁻-type semiconductor layer 12 and to reach the first n⁻-type semiconductor layer 11. However, for the purpose of securing the breakdown voltage and reducing the forward voltage VF, the trenches 5 are formed so that the second n⁻-type semiconductor layer 12 is equal to or slightly shallower than the p⁺-type semiconductor region.

Figure 5A:
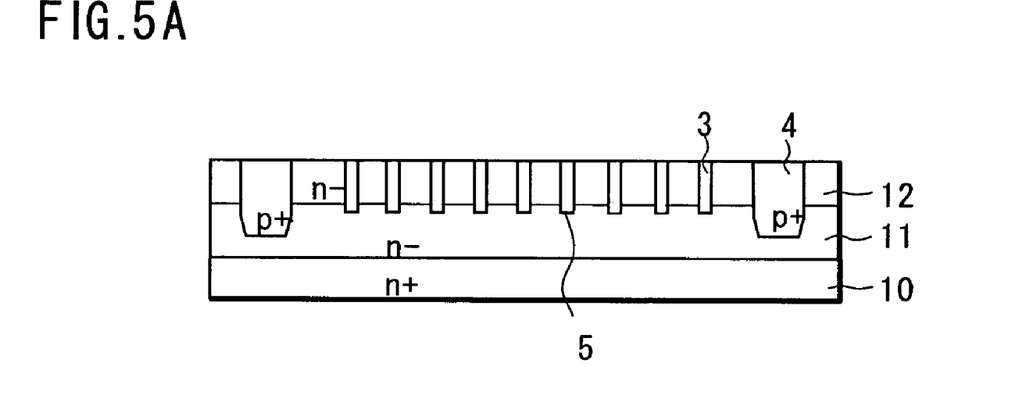
FIGS. 5A and 5B are sectional views for showing the manufacturing method of the semiconductor device according to the embodiment of the invention.

In FIG. 5A, polysilicon in which high concentration p-type impurities is embedded in all the trenches 5. That is, after non-doped polysilicon is deposited on the whole surface, high concentration p-type impurities are introduced. Alternatively, polysilicon in which high concentration p-type impurities are introduced is deposited. Thereafter, the whole surface is etched back, the polysilicon is embedded in the trenches 5, and p⁺-type semiconductor regions 3 are formed. The p⁺-type semiconductor regions 3 are disposed at regular intervals of such a width that the second n⁻-type semiconductor layer 12 is completely filled with a depletion layer at the time of applying the reverse voltage.

Although not shown, in this embodiment, the p⁺-type semiconductor regions 3 may be diffusion regions. In that case, a mask with hexagonal openings having an opening width (width in a diagonal) of about 1 μm is used, and ion implantation and diffusion of high concentration p-type impurities are performed, so that the p⁺-type semiconductor regions 3 are formed. Also in this case, they are formed so as to pass through the second n⁻-type semiconductor layer 12 and to reach the first n⁻-type semiconductor layer 11.

Figure 5B:
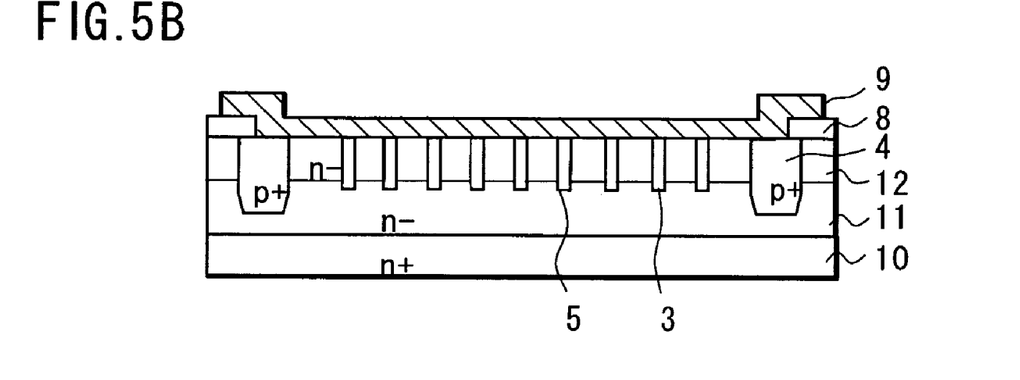

In FIG. 5B, the oxide film attached to the whole surface by the past diffusion step and the like is removed, and all the p⁺-type semiconductor regions 3 and the surface of the n⁻-type semiconductor layer 12 are exposed. Besides, an oxide film 8 is formed by a CVD method, and a part of the guard ring 4 is also exposed to achieve contact with a Schottky metal layer. That is, the oxide film 8 on the surface of the substrate inside of the guard ring 4 and on the surface of the part of the guard ring 4 is removed by etching, and a contact region with a Schottky metal layer is exposed.

Then, a Schottky metal layer 9 of, for example, Mo is evaporated. After the Schottky metal layer 9 is patterned into a desired shape covering at least the Schottky junction area, an anneal processing is performed at 500 to 600° C. for forming silicide. Here, in this embodiment, although the resistivity ρ2 of the second n⁻-type semiconductor layer 12 is optimized to realize lowering the forward voltage VF, when Ti, Ni, Cr or the like having lower φBn is used, the forward rising voltage can be reduced (see FIG. 3).

Thereafter, an Al layer which becomes an anode electrode 13 is evaporated on the whole surface, and is patterned into a desired shape. A cathode electrode 14 of, for example, Ti/Ni/Au is formed on the back surface, and the final structure shown in FIG. 1 is obtained.

Figure 6A:
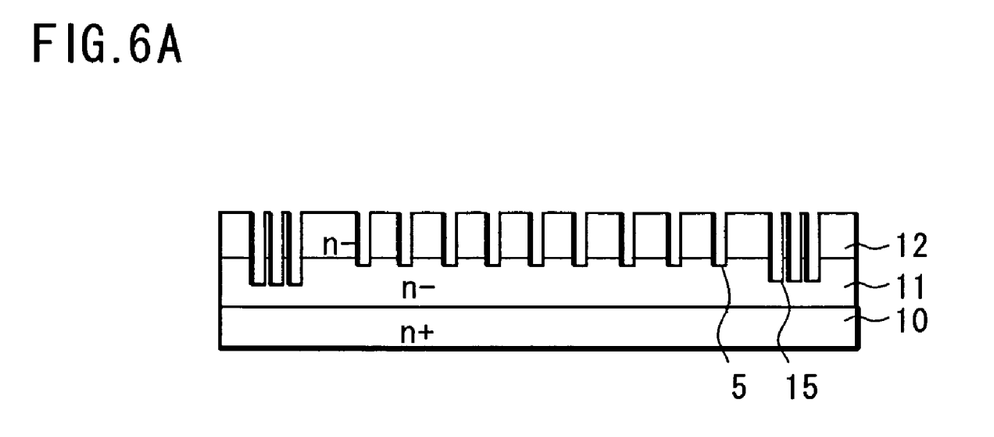
FIGS. 6A and 6B are sectional views for showing the manufacturing method of the semiconductor device according to the embodiment of the invention.
Figure 6B:
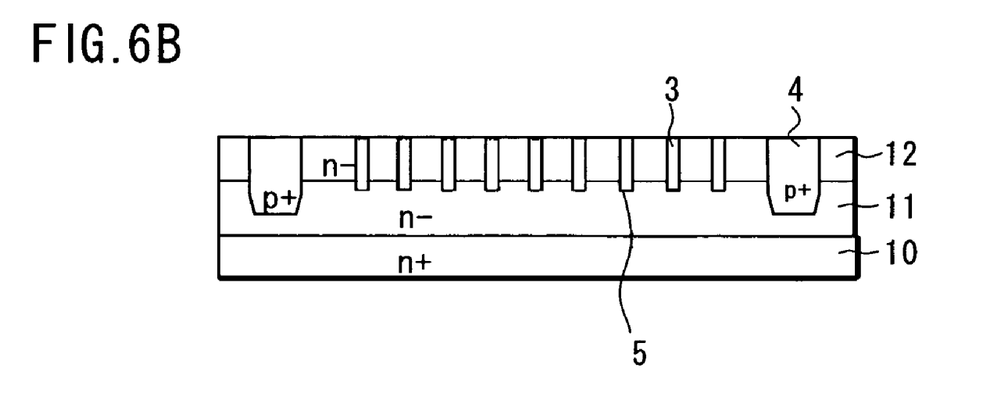

As shown in FIGS. 6A and 6B, similarly to the p⁺-type semiconductor regions 3, the guard ring 4 may be formed by embedding polysilicon in a trench. That is, a plurality of trenches 15 are formed at lines and spaces of, for example, about 1 μm in the region of the guard ring 4 (FIG. 6A), and polysilicon including high concentration p-type impurities is embedded. Thereafter, a very small amount of high concentration p-type impurity is diffused from the adjacent trench 5 by heat treatment, so that the impurity regions are united, and the wide guard ring 4 having a width of about 20 μm can be formed (FIG. 6B).

When a specified breakdown voltage can be secured by a depth equal to that of the p⁺-type semiconductor regions 3, the guard ring 4 may be formed at the same process as the formation of the trenches 5 of the p⁺-type semiconductor regions 3 and the embedding of polysilicon.

What is claimed is:

1. A semiconductor device comprising:
    a semiconductor substrate of a first general conductivity type having a first resistivity;
    a first semiconductor layer of the first general conductivity type disposed directly on the substrate and having a second resistivity;
    a second semiconductor layer of the first general conductivity type disposed on the first semiconductor layer and having a third resistivity;
    a plurality of semiconductor regions of a second general conductivity type disposed in the first and second semiconductor layers, the semiconductor regions not completely penetrating the first semiconductor layer; and
    a metal layer disposed on the second semiconductor layer so as to form a Schottky junction with the second semiconductor layer and to be in contact with the semiconductor regions,
    wherein the semiconductor regions are arranged so that depletion layers extending from the semiconductor regions under an application of a reverse voltage fill the second semiconductor layer between the semiconductor regions, and
    the third resistivity is higher than the first resistivity and lower than the second resistivity.

2. A semiconductor device according to claim 1, wherein the semiconductor regions penetrate the second semiconductor layer to reach the first semiconductor layer.

3. A semiconductor device according to claim 1, wherein a thickness of the second semiconductor layer is equal to or slightly smaller than a depth of the semiconductor regions.

4. A semiconductor device according to claim 1, wherein the resistivity of the first semiconductor layer is determined so as to secure a specified breakdown voltage.

5. A semiconductor device according to claim 1, wherein the semiconductor regions are made of semiconductor materials that are of the second general conductivity type and embedded in trenches formed in the first and second semiconductor layers.

6. A semiconductor device according to claim 1, wherein the semiconductor regions comprise regions of the first and second semiconductor layers in which impurities of the second general conductivity type are diffused.

* * * * *